US011431346B2

(12) United States Patent
Ha et al.

(10) Patent No.: US 11,431,346 B2
(45) Date of Patent: Aug. 30, 2022

(54) DEVICES AND METHODS FOR ANALOG-TO-DIGITAL CONVERSION

(71) Applicant: Infineon Technologies AG, Neubiberg (DE)

(72) Inventors: Tien Thanh Ha, Singapore (SG); Chin Yeong Koh, Singapore (SG); Kiat How Tan, Singapore (SG)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/196,627

(22) Filed: Mar. 9, 2021

(65) Prior Publication Data

US 2021/0288657 A1 Sep. 16, 2021

(30) Foreign Application Priority Data

Mar. 12, 2020 (DE) .......................... 102020106766.6

(51) Int. Cl.
*H03M 1/08* (2006.01)
(52) U.S. Cl.
CPC ......... *H03M 1/089* (2013.01); *H03M 1/0845* (2013.01)
(58) Field of Classification Search
CPC .. H03M 1/089; H03M 1/0845; H03M 1/0621; H03M 1/0678; H03M 1/60
USPC ................................................ 341/120–155
See application file for complete search history.

(56) References Cited

U.S. PATENT DOCUMENTS

| | | | | |
|---|---|---|---|---|
| 6,111,533 A | * | 8/2000 | Yuan | H03M 1/0621 341/157 |
| 8,421,663 B1 | * | 4/2013 | Bennett | H03M 1/0678 341/157 |
| 2012/0050086 A1 | * | 3/2012 | Ito | H03M 1/60 341/155 |
| 2017/0031441 A1 | | 2/2017 | Muller et al. | |
| 2019/0068216 A1 | | 2/2019 | Sai et al. | |
| 2020/0059239 A1 | | 2/2020 | Deutscher et al. | |

FOREIGN PATENT DOCUMENTS

DE 3726582 A1 2/1989

OTHER PUBLICATIONS

Quintero, Andres et al., "A VCO-Based CMOS Readout Circuit for Capacitive MEMS Microphones", Sensors, MDPI, Sep. 24, 2019, 17 pages.

* cited by examiner

*Primary Examiner* — Lam T Mai
(74) *Attorney, Agent, or Firm* — Slater Matsil, LLP (57) ABSTRACT

A device is provided comprising a first oscillator based analog-to-digital converter configured to receive an analog input signal and output a first digital signal and a second oscillator based analog-to-digital converter configured to receive an analog reference signal and output a second digital signal. The device further comprises output logic configured to generate a digital output signal based on the first digital signal and the second digital signal.

20 Claims, 5 Drawing Sheets

DEVICES AND METHODS FOR ANALOG-TO-DIGITAL CONVERSION

This application claims the benefit of German Patent Application No. 102020106766.6, filed on Mar. 12, 2020, which application is hereby incorporated herein by reference in its entirety.

TECHNICAL FIELD

The present application relates to devices and methods for analog-to-digital conversion.

BACKGROUND

Analog-to-digital converters (ADCs) are generally used to convert analog input signals to digital output signals, which then may be further processed by digital circuitry, for example microcontrollers or microprocessors. One example are sensor applications, where one or more sensors, for example a temperature sensor, output an analog signal which is then converted to a digital signal. In some applications, requirements for resolution, accuracy and conversion speed of the analog-to-digital converter may be high. For example, temperature resolution and accuracy requirements are getting higher for automotive applications, inter alia to achieve compliance with functional safety requirements. In such applications, a temperature sensor with an analog-to-digital converter having a conversion time of less than 1 ms and a resolution of 0.1° C. may be required.

For many conventional approaches like sigma-delta analog-to-digital converters, high resolution and short conversion times may be mutually exclusive, as an increase in resolution for such analog-to-digital converters may lead to an increased conversion time and vice versa. In other approaches, to increase the resolution without increasing the conversion time, a higher sampling frequency is used. However, high sampling frequencies lead to other challenges, for example regarding the bandwidth of an integrator used, noise requirements etc. A type of digital-to-analog converters which offer high resolution and fast conversion times is a controlled oscillator-based analog-to-digital converter, for example a voltage-controlled oscillator-based analog-to-digital converter. However, conventional implementations of such converters may have drawbacks regarding linearity and sampling frequency error caused e.g. by process, temperature or voltage (PVT) variations.

SUMMARY

According to an embodiment, a device is provided, comprising: a first oscillator-based analog-to-digital converter configured to receive an analog input signal and output a first digital signal, a second oscillator-based analog-to-digital converter configured to receive an analog reference signal and output a second digital signal, and output logic configured to generate a digital output signal based on the first digital signal and the second digital signal.

In another embodiment, a method is provided, comprising: generating a first digital signal by providing an analog input signal to a first oscillator-based analog-to-digital converter, generating a second digital signal by providing an analog reference signal to a second oscillator-based analog-to-digital converter, and generating a digital output signal based on the first digital signal and the second digital signal.

The above summary is merely intended to give a brief overview over some embodiments and are not to be construed as limiting anyway, as other embodiments may include other features than the ones discussed above.

DETAILED DESCRIPTION OF ILLUSTRATIVE EMBODIMENTS

In the following, various embodiments will be described in detail referring to the attached drawings. These embodiments are given by way of example only and are not to be construed as limiting. For example, while embodiments may be described comprising a plurality of features (for example method acts or events, components, elements etc.), in other embodiments some of these features may be omitted or may be replaced by alternative features. In addition to the features explicitly shown and described, other features, for example features used in conventional oscillator-based analog-to-digital converters, may be provided.

Connections or couplings shown in the drawings or described herein are electrical connections or couplings unless noted otherwise. Such connections or couplings may be modified, for example by providing additional intervening elements or removing elements, as long as the general purpose of the connection or coupling, for example transmit a certain kind of signal, to provide a voltage or current, or to transmit a certain kind of information, is essentially maintained.

Features from different embodiments may be combined unless noted otherwise. Variations or modifications described with respect to one of the embodiments are also applicable to other embodiments and will therefore not be described repeatedly for conciseness' sake.

In accordance with an embodiment, a device is provided that includes a first oscillator based analog-to-digital converter configured to receive an analog input signal and output a first digital signal and a second oscillator based analog-to-digital converter configured to receive an analog reference signal and output a second digital signal. The device further comprises output logic configured to generate a digital output signal based on the first digital signal and the second digital signal. A first oscillator of the first oscillator based analog-to-digital converter and a second oscillator of the second oscillator based analog-to-digital converter are configured to operate without any clock signal provided to the first oscillator and the second oscillator.

Figure 1:
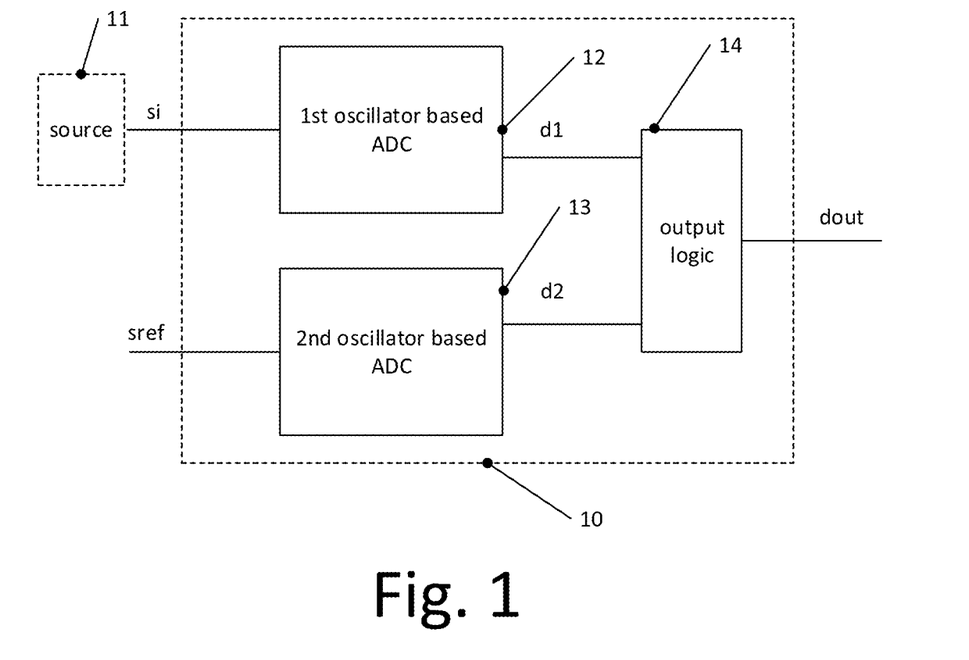
FIG. 1 is a block diagram of a device according to some embodiments.

Turning now to the figures, FIG. 1 is a block diagram of a device 10 according to an embodiment.

Device 10 receives an analog input signal si from a source 11 and an analog reference signal sref. In some embodiments, analog input signal si may be an input voltage, and analog reference signal sref may be a reference voltage. In some embodiments, source 11 may be a sensor like a temperature sensor, but is not limited thereto.

Analog input signal si is provided to a first oscillator-based analog-to-digital converter 12 of device 10. In response to receiving analog input signal si, first oscillator-based analog-to-digital converter 12 outputs a first digital signal d1.

As used herein, an oscillator-based analog-to-digital converter is an analog-to-digital converter which uses an oscillator and counter to generate a digital output signal in response to an analog input signal. In some implementations, the oscillator of the oscillator-based analog-to-digital converter may be a controlled oscillator. A controlled oscillator is an oscillator the output frequency of which is controllable by a control signal. Examples of such controlled oscillators include voltage-controlled oscillators (VCOs), where the control signal is a voltage signal, and current-controlled oscillators, where the control signal is a current signal. In such implementations of digital-to-analog converters, the control signal is a signal based on the analog input signal of the oscillator-based analog-to-digital converter (ADC), either the input signal itself or a signal derived from the input signal. This causes the output frequency of the oscillator to vary depending on the input signal. A counter may then be used to convert the frequency to a digital value with a certain sampling frequency, which is then used as the digital output signal of the analog-to-digital converter or on which the digital output signal is based. Such a sampling frequency may be based on an external clock.

Reference signal sref is provided to a second oscillator-based analog-to-digital converter 13, which in response thereto outputs a second digital signal d2.

First digital signal d1 and second digital signal d2 are provided to an output logic 14. Output logic 14 generates a digital output signal dout based on first digital signal d1 and second digital signal d2. For example, dout may be based on ratios of values of d2 and d1. Generally, second digital signal d2 may serve as a kind of reference or calibration for first digital signal d1, e.g. to compensate for process variations, temperature variations or variations in supply voltage (PVT variations) which affect both first oscillator-based analog-to-digital converter 12 and second oscillator-based analog-to-digital converter 13. More specifically, combining the first and second digital output signals e.g. by forming ratios may compensate variations in the above-mentioned sampling frequency of first and second oscillator-based analog-to-digital converters 12, 13, which may be due to PVT variations. In this way, a so-called sampling frequency error may be removed or at least reduced in some embodiments.

In some embodiments, second oscillator-based analog-to-digital converter 13 may be a replica of first oscillator-based analog-to-digital converter 12. For example, analog-to-digital converters 12, 13 may be implemented based on a same layout and/or may be formed in the same processes.

In such implementations, process variations, temperature variations, variations in supply voltage and the like may affect both analog-to-digital converters 12, 13 in the same or a similar manner, which in some implementations may help to compensate such effects by using first and second digital signals d1, d2. In this way, in some embodiments, the overall accuracy of the oscillator based analog-to-digital may be further improved regardless of a sampling frequency variation.

Generally, first oscillator-based analog-to-digital converter 12 and second oscillator-based analog-to-digital converter 13 may be implemented in any conventional manner. In particular, implementations, analog-to-digital converters 12, 13 may be implemented as linearized closed loop-based analog-to-digital converters, where a feedback from an output of the oscillator is provided. Examples for such implementations will be discussed later referring to FIGS. 2 and 5.

Figure 2:
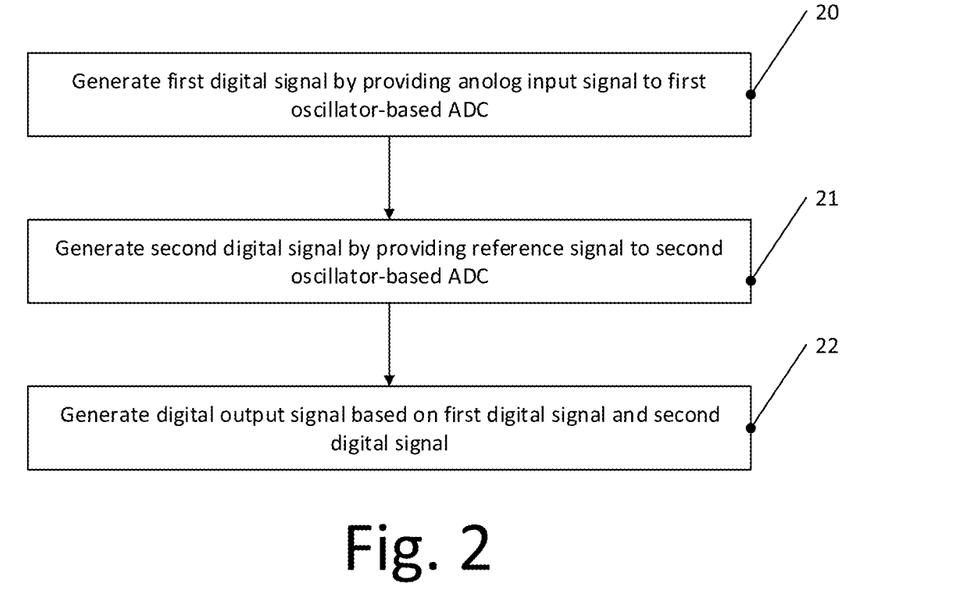
FIG. 2 is a flow chart illustrating a method according to some embodiments.

Before discussing example implementation details, methods according to some embodiments will be discussed. FIG. 2 is a flow chart illustrating a method according to some embodiments. The method of FIG. 2 may be implemented using device 10 of FIG. 10 or any of the devices discussed further below, but may also be implemented independently therefrom. Nevertheless, in order to avoid repetitions, the method of FIG. 2 will be explained referring to the previous explanations for device 10 of FIG. 1, and any details described with respect to FIG. 1, for example regarding the implementation of oscillator-based analog-to-digital converters, are also applicable to the method of FIG. 2 and will therefore not be repeated.

While the method of FIG. 2 is shown and described as a series of acts or events, the order in which these acts or events are presented is not to be construed as limiting. For example, the acts at 20 and 21 in FIG. 2 may be performed in parallel in different parts of the circuit, and the method may be performed continuously or repetitively to provide digital output values corresponding to an analog input signal over time.

At 20, the method comprises generating a first digital signal by providing an analog input signal to a first oscillator-based analog-to-digital converter, for example providing analog input signal si to first oscillator-based analog-to-digital converter 12 in FIG. 1 to generate first digital signal d1. At 21, the method comprises generating a second digital signal by providing an analog reference signal to a second oscillator-based analog-to-digital converter, for example providing analog reference signal sref to second oscillator-based analog-to-digital converter 13 of FIG. 1. In embodiments, no clock signal, in particular no common clock signal, is supplied to oscillators of the first and second oscillator-based analog-to-digital converters used at 20 and 21, as already explained for FIG. 1.

At 22, the method comprises generating a digital output signal based on the first digital signal and the second digital signal, for example as explained for output logic 14 of FIG. 1 generating digital output signal dout.

Figure 3:
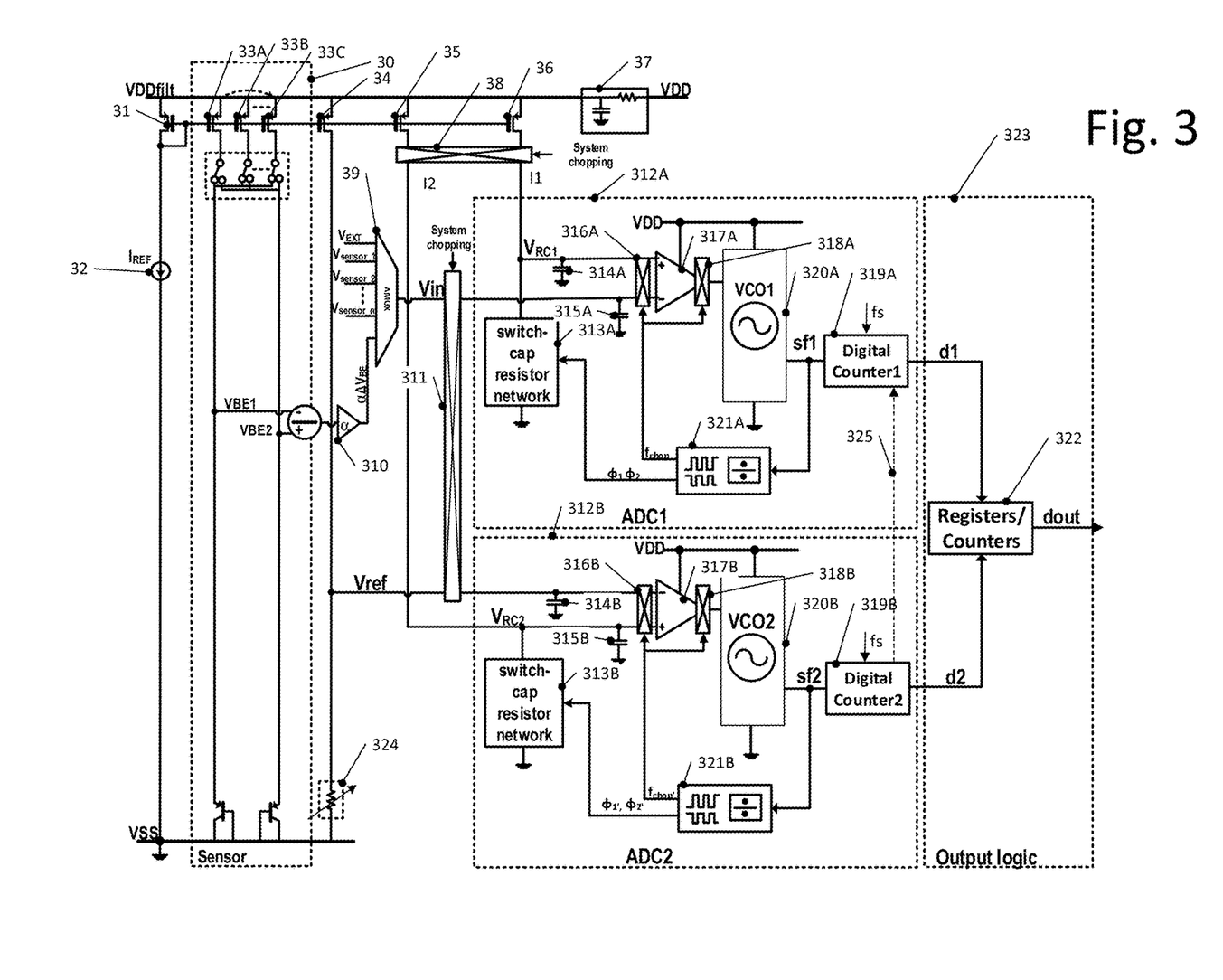
FIG. 3 is a circuit diagram of a device according to some embodiments.

FIG. 3 is a diagram of a system including a device according to an embodiment, which illustrates possible, non-limiting implementation details for components already discussed with reference to FIGS. 1 and 2.

The system of FIG. 3 comprises a temperature sensor 30 as an example for a source of an analog input signal, and further comprises a device according to an embodiment including a first oscillator-based analog-to-digital converter 312A, a second oscillator-based analog-to-digital converter 312B and an output logic 323. Analog-to-digital converters 312A, 312B and output logic 323 may serve as implementation examples for analog-to-digital converters 12, 13 and output logic 14 of device 10 of FIG. 1.

The system of FIG. 3 is supplied by a positive supply voltage VDD and a negative supply voltage VSS. VSS as shown may correspond to or be connected to ground. Positive supply voltage VDD is filtered by a low pass filter 37 to provide a filtered supply voltage VDDfilt.

A reference current source 32 coupled between VDDfilt and VSS generates a reference current, which is mirrored via a current mirror arrangement comprising a first transistor 31 and a plurality of second transistors 33A to 33C, 34, 35 and 36 to supply various parts of the system of FIG. 3.

Temperature sensor in the example of FIG. 3 is a bandgap reference sensor with a plurality of branches for dynamic element matching (DEM), which outputs a difference between two voltages VBE1, VBE2. The difference is then amplified by a factor α by an amplifier 310 to result in a voltage $\alpha \Delta V_{BE}$ which is indicative of the measured temperature. While a specific implementation of a bandgap-based temperature sensor is shown, any conventional implementation of such a temperature sensor or other types of sensors or input signal sources other than sensors may be used.

Voltage $\alpha \Delta V_{BE}$ is provided to an input multiplexer 39. Other voltages provided to input multiplexer 39 may include an external voltage $V_{EXT}$ or voltage outputs from other sensors (not shown), $V_{sensor\_1}$ to $V_{sensor\_n}$. External voltage $V_{EXT}$ may for example be supplied for testing or calibration purposes. Input multiplexer 39 selects one of these voltages and outputs them as an input voltage Vin to first oscillator-based analog-to-digital converter 312A. In this way, a single device for analog-to-digital conversion may be used for a plurality of sources, for example a plurality of sensors. In other embodiments, input multiplexer 39 may be omitted, and $\alpha \Delta V_{BE}$ may be provided as input voltage Vin directly.

Moreover, by using an adjustable resistor 324, an adjustable reference voltage Vref is generated, which is provided to second oscillator-based analog-to-digital converter 312B.

Voltages Vin, Vref as well as currents provided to analog-to-digital converters 312A, 312B are chopped via choppers 38, 311. This chopping by choppers 38, 311 is also referred to as system chopping. Chopping generally reduces noise and/or offsets caused by a system offset itself when looking from input to output of a system for example mismatches of transistor 35 and 36, a charge-injection and clock feedthrough of switches at switch-cap networks 313A, 313B.

The thus chopped voltage Vin is provided to first oscillator-based analog-to-digital converter 312A, which will be described next.

The chopped voltage Vin is provided to a negative input of a gain stage 317A. Furthermore, a feedback voltage $V_{RC1}$ is provided to a positive input of a gain stage 317A. An output signal of gain stage 317A depends on a difference between the chopped input voltage Vin and the feedback voltage $V_{RC1}$ and is provided to a control input of a voltage-controlled oscillator 320A, which in response to the control signal outputs an output signal sf1 having a frequency $f_1$. Choppers 316A, 318A are provided at the inputs and at the output of gain stage 317A to provide offset cancellation for gain stage 317A. 314A and 315A are parasitic capacitances at the inputs of gain stage 317A.

The output signal sf1 of voltage-controlled oscillator 320A (VCO) is provided to a digital counter 319A, which for examples counts rising edges, falling edges or both of signal sf1. A count value of digital counter 319A is provided as a first digital signal d1. Digital counter 319A is reset corresponding to a desired sampling frequency fs, which is lower than the frequency $f_1$ of signal sf1. Sampling frequency fs may be derived from an external clock signal in some embodiments.

Signal sf1 is furthermore provided to a divider/logic circuit 312A which provides a frequency-divided version of sf1 as chopper signal $f_{chop}$ controlling choppers 316A, 318A. Furthermore, divider and logic 321A provides phase signals $\Phi_1$, $\Phi_2$ which have a frequency corresponding to a divided frequency of signal sf1 (for example the same frequency as $f_{chop}$) and phases opposite to each other, with dead times (where both signal $\Phi_1$, $\Phi_2$ have the same state) inserted in-between. Signals $\Phi_1$, $\Phi_2$ are used to control switches of a switch/capacitor/resistor network 313A. The dead times serve to ensure that no short circuit occurs, for example by avoiding that all switches are closed at the same time. The switching of switches of switch/capacitor/resistor network 313A based on signals $\Phi_1$, $\Phi_2$ generates feedback voltage $V_{RC1}$. By the thus formed feedback loop, a so-called linearized closed loop voltage-controlled oscillator-based analog-to-digital converter is formed, where the feedback in the closed loop in particular improves the linearity of the analog-to-digital conversion, such that there is an essentially linear dependence between the voltage Vin and corresponding values of the first digital signal d1.

Second oscillator based analog-to-digital converter 312B is built as a replica of first oscillator based analog-to-digital converter 312A.

Elements of second oscillator based analog-to-digital converter 312B corresponding to elements of first oscillator based analog-to-digital converter 312A bear the same reference numeral with the "A" replaced by a "B". For example, a gain stage 317B is provided which corresponds to the above-described gain stage 317A. As second oscillator based analog-to-digital converter 312B is a replica of first oscillator based analog-to-digital converter 312A, it will not be described again in detail, but only the differences to first oscillator based analog-to-digital converter 312A will be described.

In second oscillator based analog-to-digital converter 312B, the chopped reference voltage Vref is provided to a negative input of gain stage 317B, and a feedback signal $V_{RC2}$ generated by switch/capacitor/resistor network 313B is provided to a positive input of gain stage 317B. Voltage controlled oscillator 320B outputs a signal sf2 to digital counter 319B, which outputs a second digital signal d2, and to divider/logic circuit 321B, which outputs phase signals $\Phi1'$, $\Phi2'$ controlling switch/capacitor/resistor network 313B in a similar manner as signals $\Phi1$, $\Phi2$ control switch/capacitor/resistor network 313A. Otherwise, as can be seen, the configuration of the analog-to-digital converters 312A, 312B correspond to each other.

First and second digital signals d1, d2 are provided to output logic 323, which in the embodiment of FIG. 3 comprises registers and/or counters 322 to combine signals d1, d2 to form output signal dout. For example, in some embodiments signal values of signal dout may be based on ratios of signal values of signal d2 to signal values of signal d1 or vice versa. In this way, as already mentioned above, in some embodiments effects of variations of the sampling frequency fs, e.g. PVT variations, may be reduced or mitigated.

It should be noted that while in the above-described embodiment, the sampling frequency may be supplied externally to both digital counters 319A, 319B, which may be referred to as synchronous counters in other embodiments the sampling frequency may also be determined by second digital counter 319B, which may be referred to as asynchronous counters.

For such embodiments, digital counter 319B of second oscillator-based analog-to-digital converter 312B is configured as a free-running counter that counts a predefined number of edges (falling edges, rising edges or both) of signal sf2. As a constant reference voltage Vref is supplied to second oscillator-based analog-to-digital converter 312B, frequency $f_2$ of signals sf2 is constant and based on Vref. After the predefined number of edges has been counted, a signal is sent to digital counter 319A to cause sampling, as indicated by a dashed line 325 in FIG. 3. The sampling frequency fs in this case is determined by frequency $f_2$ of signal sf2 (and hence by Vref) and the predefined numbers of edges counted by digital counter 319B. Also in this case, by combining first and second digital signals d1, d2 in output logic 323, variations of the thus generated sampling frequency fs, which may be caused for example by variations of Vref, may be compensated.

Operation of the embodiment of FIG. 3 will now be explained in some more detail referring to FIGS. 4A to 4C.

Figure 4A:
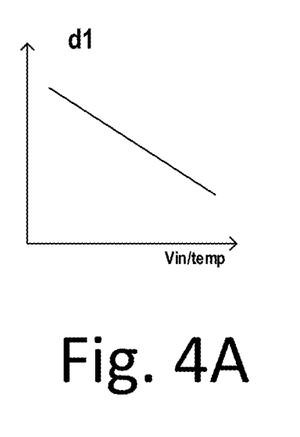
FIGS. 4A to 4C are diagrams illustrating an example behavior of the device of FIG. 3.
Figure 4B:
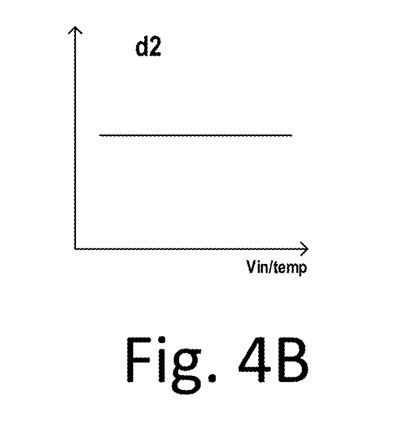
Figure 4C:
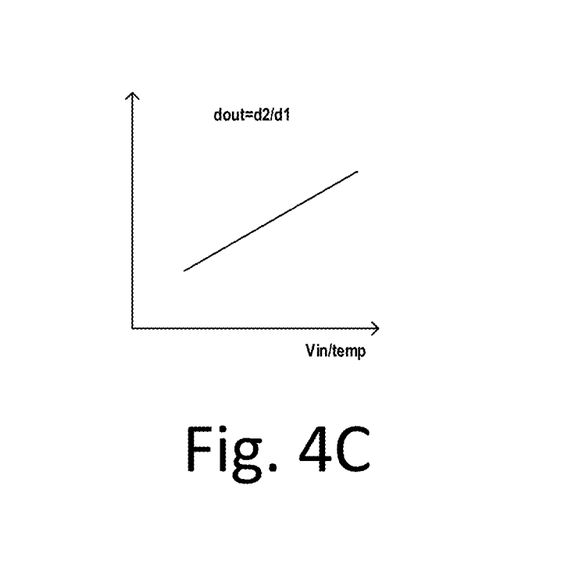

FIG. 4A shows an example for the dependency of first digital signal d1 from the input voltage Vin (which in turn depends on the temperature), and FIG. 4B shows an example dependency of second digital signal d2 from Vin. With the analog-to-digital converter configuration of analog-to-digital converters 312A, 312B, signal values of first digital signal d1 may fall with rising temperature as shown in FIG. 4A, while values of second digital signal d2 (which are essentially a digital version of reference voltage Vref) are constant. d2 divided by d1 gives a linear dependence of dout from the temperature. Process variations, temperature variations e.g. of the oscillators 320A, 320B or variations in the supply voltage VDD and other fluctuations which could lead to sampling errors in conventional oscillator based analog-to-digital converters are compensated or mitigated, as they essentially affect both analog-to-digital converters 312A, 312B and therefore at least partially cancel each other out when forming the ratio as in FIG. 4C. In this way, in some implementations requirements regarding linearity and resolution of analog-to-digital conversion may be met with a device as shown in FIG. 3, for example in some automotive applications as discussed initially.

Figure 5:
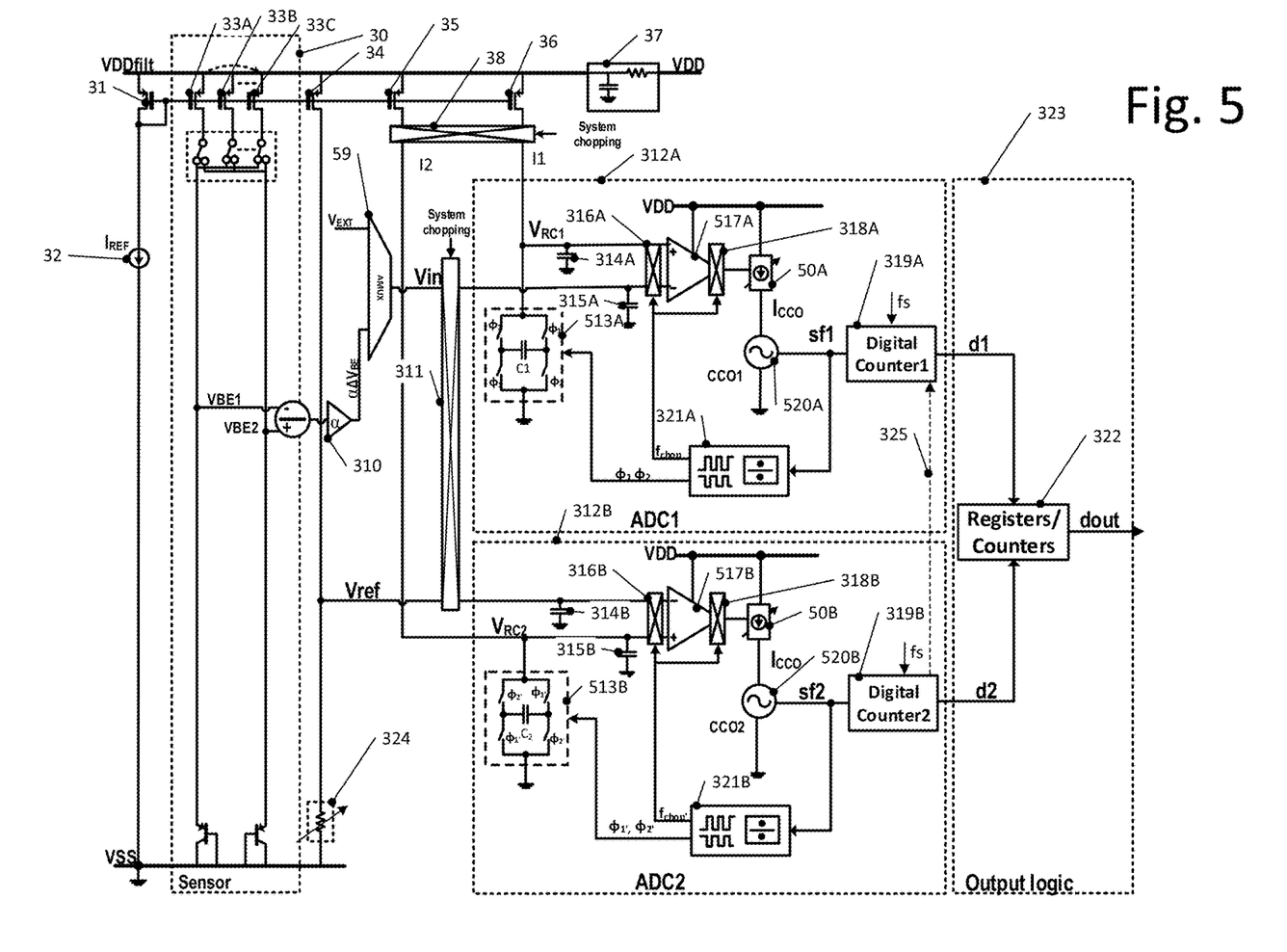
FIG. 5 is a circuit diagram of a device according to some further embodiments.

FIG. 5 is a system according to a further embodiment. The system shown in FIG. 5 is a modification of the system of FIG. 3, and corresponding elements bear the same reference numerals. In the following, in order to avoid repetitions, only the modifications compared to FIG. 3 will be described in detail. It should be noted that the various modifications described in the following are independent from each other.

A first difference between the system of FIG. 5 and the system of FIG. 3 is that multiplexer 39 of FIG. 3 has been replaced by a multiplexer 59. Multiplexer 59 selectively provides the voltage $\alpha \Delta V_{BE}$ indicative to the temperature or external voltage $V_{EXT}$ as voltage Vin to first oscillator based analog-to-digital converter 312A, without providing inputs for further sensors. As mentioned, in other embodiments, multiplexer 59 or 39 may be omitted, and $\alpha \Delta V_{BE}$ may be directly supplied as input voltage Vin.

A second modification compared to the embodiment of FIG. 3 is that specific switch/capacitor/resistor networks are shown, namely switched capacitor networks 513A and 513B. Each network 513A, 513B comprises four switches and a capacitor C1 or C2, respectively, which are coupled as shown in FIG. 5. The switches are switched controlled by the signals Φ1, Φ2, Φ1' or Φ2' given next to the respective switch in FIG. 5. Networks 513A, 513B are a non-limiting example for a usable switch/capacitor/resistor network. In other implementations, for example more than one capacitor may be used, and resistors may be additionally used.

A third modification is that as gain stages 317A, 317B in FIG. 5 operational transconductance amplifiers (OTAs) 517A, 517B are used, which control a controllable resistor 50A, 50B, respectively, to provide a control current ICCO to a respective current controlled oscillator (CCO) 520A, 520B. In other words, in FIG. 5 operational transconductance amplifiers are used as gain stages, and current controlled oscillators are used instead of voltage controlled oscillators. This shows that different types of controlled oscillators may be used in different embodiments.

Otherwise, the embodiment of FIG. 5 corresponds to the embodiment of FIG. 3.

Operation of the embodiment of FIG. 5 will now be described in some more detail:

The voltage $\alpha \Delta V_{BE}$ is a voltage proportional to absolute temperature (PTAT). The amplification by a may improve the dynamic range of controlled oscillators described further below. The number of bits obtainable by controlled oscillator based analog-to-digital converters like analog-to-digital converters 12, 13, 312A, 312B discussed above is $$N = \log_2\left(\frac{N_{cyc} * (fvco_{max} - fvco_{min})}{fs}\right) \rightarrow cnt_{wdw} =$$

$$N_{cyc} * \frac{1}{fs} = \left(\frac{2^N}{fvco_{max} - fvco_{min}}\right)$$

where N is the number of bits, $fvco_{MAX}$ is the maximum frequency of the controlled oscillator, $fvco_{min}$ is the minimum frequency of the controlled oscillator, fs is the sampling frequency defining a windowing of digital counters 319A, 319B, $N_{eye}$ is the number of cycles of the sampling frequency used, i.e. denotes essentially how many counts of digital counters 319A, 319B are used. $cnt_{wdw}$ is a counter window.

The tuning range of the controlled oscillator is $(fvco_{max} - fvco_{min})$

For example, if the tuning range of VCO is $(fvco_{max} - fvco_{min}) = 120$ MHz which is corresponding to $\alpha \Delta V_{BE}$ variation from $-40°$ C. to $180°$ C. ($fvco_{max} = 200$ MHz and $fvco_{min} = 80$ MHz), the sampling frequency fs=1 MHz and resolution $0.1°$ C. per step (N=13 bit). Then $cnt_{wdw} = 68.3$ μs which means that one temperature conversion time is only 68.3 μs. It should be noted that these numerical values serve only as illustrative example and may depend on implementation.

With such a short conversion time, in some embodiments also more conversions may be done together with the system chopper by choppers 38, 311 and then averaging the final office output data to eliminate offsets and quantization noise while still maintaining a conversion time below 500 μsec.

The switch capacitor networks 513A, 513B lead to resistance values RC1, RC2, respectively according to $$RC1 = \frac{1}{(f_1 * C1)}$$

$$RC2 = \frac{1}{(f_2 * C2)}$$

$f_1$ is the frequency of signal SF2, and $f_2$ is the frequency of signal sf2.

Operation of controlled oscillator based analog-to-digital converter 312A of FIG. 5 are as follows: at the positive input of operational transconductance amplifier 517A a voltage $V_+$ is applied, and at the negative voltage a voltage $V_-$ is applied according to $$V_- = Vin \ldots V_+ = V_{RC1} = \frac{I1}{f_1 * C1}$$

With the high gain of operational transconductance amplifier 517A and the negative feedback loop shown, this leads to $V_- = V_+$ i.e. the feedback loop forces the voltages $V_-$ and $V_+$ to be equal. From this follows $$Vin = V_{RC1} = \frac{I1}{f_1 * C1} \rightarrow f_1 = \frac{I1}{Vin * C1} \quad (1)$$

Equation (1) represents the relation between the frequency $f_1$ of signal sf1 output-to-digital counter 319A and the input signal Vin, which in turn is representative of the temperature measured by sensor 30. Values of C1 and I1 are selected in such a way to increase the dynamic range of frequency $f_1$ across the temperature range. This may improve the resolution of the analog-to-digital converter.

Correspondingly, for the second controlled oscillator based analog-to-digital converter 312B the following equations apply:

$$V_- = Vref \quad (2)$$
$$V_+ = V_{RC2} = \frac{I2}{f_2 * C2}$$
$$V_- = V_+ \rightarrow Vref = V_{RC2} = \frac{I2}{f_2 * C_2} \rightarrow f_2 = \frac{I2}{Vref * C_2}$$

Equation (2) represents the relationship between a frequency $f_2$ of signal sf2 and the reference voltage Vref. By selecting values of I2, Vref and C2 a desired value of $f_2$ is defined. Frequency $f_2$ may be trimmed at a certain accuracy level over voltage supply, process and temperature (PVT) variations so that a stable in varied reference with respect to temperature may be generated. In some embodiments, a frequency value of $f_2$ is selected to be less than or equal to the minimum value of $f_1$, fvco$_{min}$, of the first controlled oscillator based analog-to-digital converter 312A. Digital counters 319A, 319B in the implementations of FIGS. 3 and 5 as explained above May be implemented in two approaches:

They may be implemented as a synchronous counter which may capture the rising edge of signals sf1, sf2, respectively by using sampling frequency fs supplied externally or they may be implemented as an asynchronous counter where digitals counter 319B determines the sampling of digital counter 319A as explained above.

For the synchronous counter implementations, the sampling frequency fs may be derived from a main clock of the system, for example a 20 MHz clock. This frequency fs usually varies over temperature, which in conventional implementations may cause an additional error. However, this error may be compensated using output logic 322 and both first and second digital signals d1, d2, as explained below.

First digital signal d1 is $$d1 = cnt_{wdw1} * f_1 = N_{cyc1} * \left(\frac{1}{fs_s}\right) * f_1 \quad (3)$$

and second digital signal d2 is $$d2 = cnt_{wdw2} * f_2 = N_{cyc2} * \left(\frac{1}{fs}\right) * f_2 \quad (4)$$

In equations (3) and (4), the indices "1" and "2" at cnt$_{wdw}$ and N$_{cyc}$ refer to values for the first oscillator based analog-to-digital converter 312A and the second oscillator based analog-to-digital converter 312B, respectively.

By forming output signal dout as the ratio of d2 and d1

$$dout = \frac{d2}{d1} = \left(\frac{f_2}{f_1}\right) = \left(\frac{N_2}{N_1}\right) * \left(\frac{I2}{I1}\right) * \left(\frac{C1}{C2}\right) * \left(\frac{Vin}{Vref}\right) = k_{DIG} * k_{ANA} * \frac{Vin}{Vref} \quad (5)$$

results, with $$k_{dig} = \frac{N_{cyc2}}{N_{cyc1}}$$

and $$k_{ana} = \left(\frac{I2}{I2}\right) * \left(\frac{C1}{C2}\right)$$

By adjusting $k_{dig}$ and $k_{ana}$, a higher digital resolution can be achieved in some implementations. The equation (5) shows that there are no impacts of sampling frequency at the final digital value.

For the asynchronous counter implementations, there are no additional sampling frequency is required. The second digital counter is configured as a free-running counter to define a windowing counter for the first digital counter of the first oscillator based analog-to-digital converter wherein the frequency $f_2$ has been trimmed at a certain accuracy level. For example, it can be a 12-bit ripple counter (counter overflow at 4096). Both digital counters will be started at the same time. The result of the first digital counter will be saved to registers when the free-running counter of the reference clock $f_2$ is overflowed. With this implementation, no external sampling clock needed and the final digital value is also obtained without any impact of sampling frequency variation.

For the case where Vin=$\alpha\Delta V_{BE}$, i.e. the output of temperature sensor 30, the digital value dout may be translated to an absolute temperature T in Kelvin (K) by a linear transfer function which is derived from PTAT characteristics of the sensor $$\alpha\Delta V_{BE} = \alpha\left(\frac{kT}{q}\ln(N_{DEM})\right)$$

$N_{DEM}$ is a number of current branches of a dynamic element matching (DEM) in the sensor 30, in the example of FIGS. 3 and 5 three branches with transistors 33A, 33B and 33C. k is the Boltzmann constant (1.380649×10$^{-23}$ J/K) and q is the elementary electron charge (1.602176634×10$^{-19}$ C). With this, equation (5) becomes $$dout = k_{DIG} * k_{ANA} * \frac{\alpha\Delta V_{BE}}{Vref} = k_{DIG} * k_{ANA} * \frac{\alpha\left(\frac{kT}{q}\ln(N_{DEM})\right)}{Vref} = A * T \quad (6)$$

with $$A = k_{dig} * k_{ana} * \frac{\alpha\left(\frac{k}{q}\ln(N_{DEM})\right)}{V_{ref}}$$

where T is the absolute temperature in Kelvin (K). If the temperature in degrees centigrade (° C.) is needed, it may be calculated according to $$T[°\ C.] = \frac{dout}{A} - T_0 \qquad (7)$$

where $T_o$=273.15.

For calibrating, Vref may be also applied as Vin (for example via multiplexer 39 or 59 as $V_{EXT}$), and the system may then be adjusted.

Figure 6:
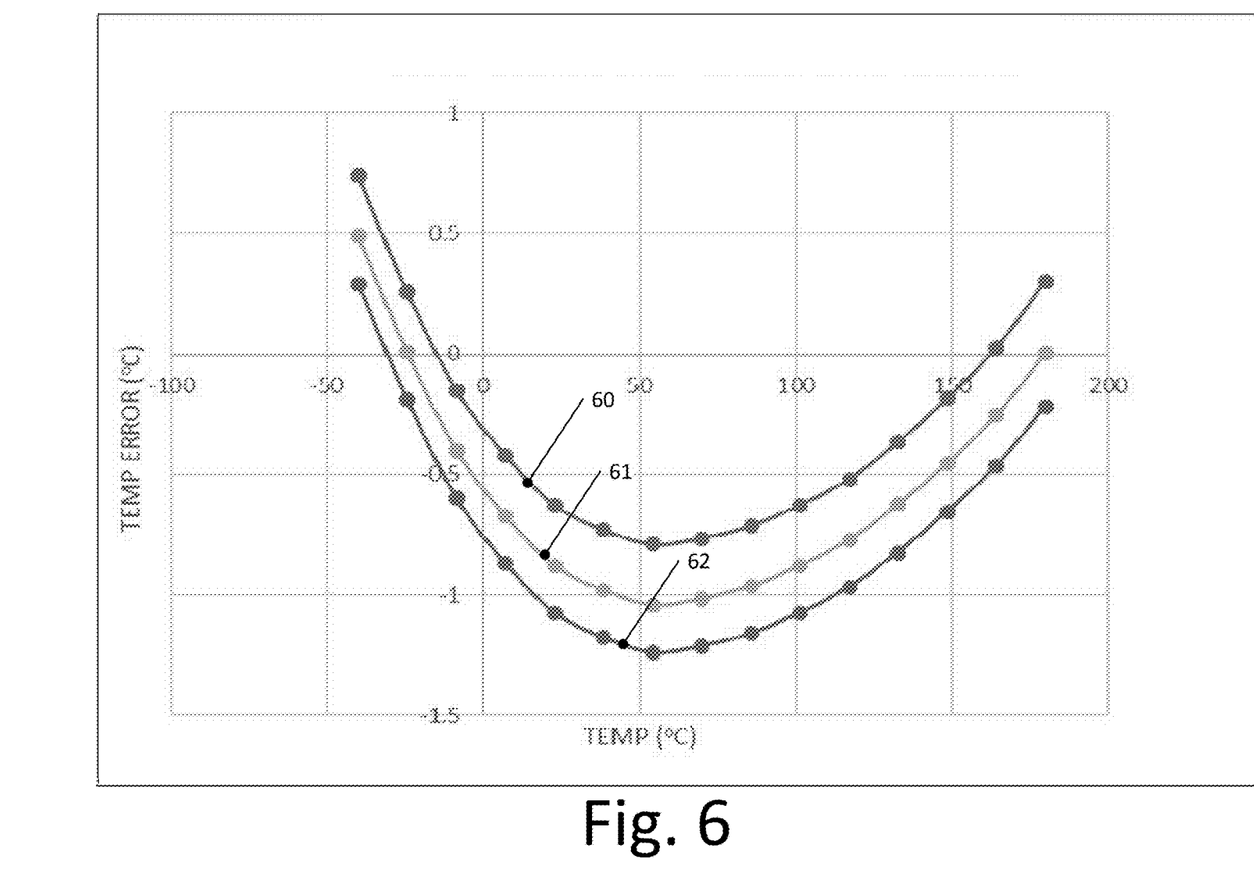
FIG. 6 is a diagram illustrating simulations of a performance of a device according to an embodiment.

FIG. 6 shows simulation results illustrating operation according to some embodiments. FIG. 6 shows a temperature error for a measured temperature using the device of FIG. 5 for analog-to-digital conversion. Curve 60 shows simulation results for a fast processed corner, curve 61 shows results for a nominal processed corner, and a curve 62 shows results for a slow processed corner. As can be seen, there are only small variations of the temperature error due to process variations, or, in other words, most of the and generally, the temperature error is below 1.5° C. over the complete temperature range shown.

Some embodiments are defined by the following examples:

Example 1. A device, comprising: a first oscillator based analog-to-digital converter configured to receive an analog input signal and output a first digital signal; a second oscillator based analog-to-digital converter configured to receive an analog reference signal and output a second digital signal; and output logic configured to generate a digital output signal based on the first digital signal and the second digital signal.

Example 2. The device of example 1, wherein the output logic is configured to generate the digital output signal based on ratios of values of the first digital signal to values of the second digital signal.

Example 3. The device of example claim 1 or 2, wherein the output logic is configured to combine the first digital signal and the second digital signal to reduce effects of variations of a sampling frequency of the first and second oscillator-based analog-to-digital converters.

Example 4. The device of any one of examples 1 to 3, wherein the first oscillator based analog-to-digital converter is a replica of the second oscillator based analog-to-digital converter.

Example 5. The device of any one of examples 1 to 4, wherein the first oscillator and the second oscillator are controlled oscillators.

Example 6. The device of example 5, wherein at least one of the first oscillator based analog-to-digital converter or the second oscillator based analog-to-digital converter comprises a linearized closed loop controlled oscillator based analog-to-digital converter.

Example 7. The device of example 6, wherein the linearized closed loop controlled oscillator based analog-to-digital converter comprises: a signal input configured to receive the analog input signal or the analog reference signal, respectively, a gain stage, wherein a first input of the gain stage is coupled to the signal input; a controlled oscillator, wherein a control input of the controlled oscillator is coupled to an output of the gain stage; a counter coupled to an output of the controlled oscillator to generate the first or second digital signal, respectively, and a feedback loop coupling the output of the controlled oscillator to a second input of the gain stage.

Example 8. The device of example 7, wherein the feedback loop comprises a switched capacitor circuit.

Example 9. The device of example 7 or 8, further comprising a first chopper arrangement at the first and second inputs and the output of the gain stage.

Example 10. The device of any one of examples 7 to 9, further comprising a second chopper arrangement provided at the signal input and a reference input coupled to the second input of the gain stage.

Example 11. The device of any one of examples 7 to 10, wherein the gain stage comprises an operational transconductance amplifier, and the controlled oscillator comprises a current controlled oscillator.

Example 12. The device of any one of examples 1 to 11, further comprising a sensor configured to provide the analog input signal.

Example 13. The device of any one of examples 1 to 12, wherein the sensor is a temperature sensor.

Example 14. The device of any one of examples 1 to 13, wherein the analog input signal is an input voltage and the analog reference signal is a reference voltage.

Example 15. The device of any one of examples 1 to 14, wherein a sampling of a counter of the first oscillator based analog-to-digital converter is controlled by a counter of the second oscillator based analog-to-digital converter.

Example 16. A method, comprising: generating a first digital signal by providing an analog input signal to a first oscillator based analog-to-digital converter; generating a second digital signal by providing an analog reference signal to a second oscillator based analog-to-digital converter; and generating a digital output signal based on the first digital signal and the second digital signal.

Example 17. The method of example 16, wherein generating the digital output signal comprises generating the digital output signal based on ratios of values of the first digital signal to values of the second digital signal.

Example 18. The method of example 16 or 17, wherein generating the digital output signal comprises combining the first and second digital signals to reduce effects of variations of a sampling frequency of the first and second oscillator-based analog-to-digital converters.

Example 19. The method of any one of examples 16 to 18, wherein the first oscillator based analog-to-digital converter is a replica of the second oscillator based analog-to-digital converter.

Example 20. The method of any one of examples 16 to 19, wherein at least one of the first oscillator based analog-to-digital converter or the second oscillator based analog-to-digital converter comprises a linearized closed loop controlled oscillator based analog-to-digital converter.

Example 21. The method of any one of examples 16 to 20, further comprising generating the analog input signal based on a sensed quantity.

Example 22. The method of any one of examples 16 to 21, further comprising chopping the analog input signal and the analog reference signal.

Example 23. The method of any one of examples 16 to 22, further comprising controlling sampling of a counter of the first oscillator based analog-to-digital converter by a counter of the second oscillator based analog-to-digital converter.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
   a first oscillator based analog-to-digital converter configured to receive an analog input signal and output a first digital signal;
   a second oscillator based analog-to-digital converter configured to receive an analog reference signal and output a second digital signal; and
   output logic configured to generate a digital output signal based on the first digital signal and the second digital signal, wherein the output logic is configured to combine the first digital signal and the second digital signal to reduce effects of variations of a sampling frequency of the first and second oscillator based analog-to-digital converters.

2. The device of claim 1, wherein the output logic is configured to generate the digital output signal based on ratios of values of the first digital signal to values of the second digital signal.

3. The device of claim 1, wherein the first oscillator based analog-to-digital converter is a replica of the second oscillator based analog-to-digital converter.

4. The device of claim 1, wherein the first and second oscillator based analog-to-digital converter each comprise a controlled oscillator.

5. The device of claim 4, wherein at least one of the first oscillator based analog-to-digital converter or the second oscillator based analog-to-digital converter comprises a linearized closed loop controlled oscillator based analog-to-digital converter.

6. The device of claim 1, wherein at least one of the first oscillator based analog-to-digital converter or the second oscillator based analog-to-digital converter comprises:
   a signal input configured to receive the analog input signal or the analog reference signal, respectively;
   a gain stage, wherein a first input of the gain stage is coupled to the signal input;
   an oscillator, wherein a control input of the oscillator is coupled to an output of the gain stage; and
   a feedback loop configured to couple an output of the oscillator to a second input of the gain stage.

7. The device of claim 6, wherein the feedback loop comprises a switched capacitor circuit.

8. The device of claim 6, further comprising at least one of:
   a first chopper arrangement at the first and second inputs and the output of the gain stage; or
   a second chopper arrangement provided at the signal input and a reference input coupled to the second input of the gain stage.

9. The device of claim 1, further comprising a sensor configured to provide the analog input signal.

10. The device of claim 1, wherein the analog input signal is an input voltage and the analog reference signal is a reference voltage.

11. The device of claim 1, wherein a sampling of a counter of the first oscillator based analog-to-digital converter is controlled by a counter of the second oscillator based analog-to-digital converter.

12. A method, comprising:
    generating a first digital signal by providing an analog input signal to a first oscillator based analog-to-digital converter;
    generating a second digital signal by providing an analog reference signal to a second oscillator based analog-to-digital converter; and
    generating a digital output signal based on the first digital signal and the second digital signal, wherein generating the digital output signal comprises combining the first and second digital signals to reduce effects of variations of a sampling frequency of the first and second oscillator based analog-to-digital converters.

13. The method of claim 12, wherein generating the digital output signal comprises generating the digital output signal based on ratios of values of the first digital signal to values of the second digital signal.

14. The method of claim 12, wherein the first oscillator based analog-to-digital converter is a replica of the second oscillator based analog-to-digital converter.

15. The method of claim 12, wherein at least one of the first oscillator based analog-to-digital converter or the second oscillator based analog-to-digital converter comprises a linearized closed loop controlled oscillator based analog-to-digital converter.

16. The method of claim 12, further comprising generating the analog input signal based on a sensed quantity.

17. The method of claim 12, further comprising chopping the analog input signal and the analog reference signal.

18. The method of claim 12, further comprising controlling sampling of a counter of the first oscillator based analog-to-digital converter by a counter of the second oscillator based analog-to-digital converter.

19. A circuit comprising:
    a chopping circuit having a signal input and a voltage reference input;
    a first oscillator based analog-to-digital converter having a first conversion input coupled to a first output of the chopping circuit;
    a second oscillator based analog-to-digital converter coupled having a second conversion input coupled to a second output of the chopping circuit; and
    a digital logic configured to determine an ratio of a first conversion output of the first oscillator based analog-to-digital converter to a second conversion output of the second oscillator based analog-to-digital converter, wherein
    the first oscillator based analog-to-digital converter comprises:
        a first chopper stabilized amplifier having a first input coupled to the first conversion input,
        a first controlled oscillator having a frequency control input coupled to an output of the first chopper stabilized amplifier,
        a first counter having an input coupled to the output of the first controlled oscillator and an output coupled to the first conversion output,
        a first frequency divider coupled to the output of the first controlled oscillator, and
        a first switched capacitor resistor coupled to an output of the first frequency divider and a second input of the first chopper stabilized amplifier, and
    the second oscillator based analog-to-digital converter comprises:
        a second chopper stabilized amplifier having a first input coupled to the second conversion input, a second controlled oscillator having a frequency control input coupled to an output of the second chopper stabilized amplifier, a second counter having an input coupled to the output of the second controlled oscillator and an output coupled to the second conversion output, a second frequency divider coupled to the output of the second controlled oscillator, and a second switched capacitor resistor coupled to an output of the second frequency divider and a second input of the second chopper stabilized amplifier.

20. A device, comprising:

a first oscillator based analog-to-digital converter configured to receive an analog input signal and output a first digital signal;

a second oscillator based analog-to-digital converter configured to receive an analog reference signal and output a second digital signal, wherein at least one of the first oscillator based analog-to-digital converter or the second oscillator based analog-to-digital converter comprises:

a signal input configured to receive the analog input signal or the analog reference signal, respectively, a gain stage, wherein a first input of the gain stage is coupled to the signal input, an oscillator, wherein a control input of the oscillator is coupled to an output of the gain stage, and a feedback loop configured to couple an output of the oscillator to a second input of the gain stage; and output logic configured to generate a digital output signal based on the first digital signal and the second digital signal.

* * * * *